(12) United States Patent
Konno

(10) Patent No.: US 10,756,047 B2
(45) Date of Patent: Aug. 25, 2020

(54) CONDUCTIVE PASTE FOR BONDING

(71) Applicant: E I DU PONT DE NEMOURS AND COMPANY, Wilmington, DE (US)

(72) Inventor: Takuya Konno, Kanagawa (JP)

(73) Assignee: E I DU PONT DE NEMOURS AND COMPANY, Wilmington, DE (US)

( * ) Notice: Subject to any disclaimer, the term of this patent is extended or adjusted under 35 U.S.C. 154(b) by 302 days.

(21) Appl. No.: 15/708,490

(22) Filed: Sep. 19, 2017

(65) Prior Publication Data

US 2018/0102341 A1 Apr. 12, 2018

(30) Foreign Application Priority Data

Oct. 6, 2016 (JP) .................. 2016-198342

(51) Int. Cl.
  *B23K 35/00* (2006.01)
  *H01L 23/00* (2006.01)
  *B23K 35/02* (2006.01)
  *B23K 35/30* (2006.01)

(52) U.S. Cl.
  CPC ............ *H01L 24/83* (2013.01); *B23K 35/025* (2013.01); *B23K 35/3006* (2013.01); *H01L 24/27* (2013.01); *H01L 24/29* (2013.01); *H01L 24/32* (2013.01); *H01L 2224/2732* (2013.01); *H01L 2224/29444* (2013.01); *H01L 2224/29455* (2013.01); *H01L 2224/32225* (2013.01); *H01L 2224/8384* (2013.01); *H01L 2224/83424* (2013.01); *H01L 2224/83439* (2013.01); *H01L 2224/83444* (2013.01); *H01L 2224/83447* (2013.01); *H01L 2224/83455* (2013.01); *H01L 2224/83464* (2013.01); *H01L 2224/83469* (2013.01); *H01L 2224/83473* (2013.01); *H01L 2924/014* (2013.01)

(58) Field of Classification Search
  CPC .. B23K 35/025; B23K 35/262; B23K 35/362; B23K 1/0016; B23K 35/0244
  See application file for complete search history.

(56) References Cited

U.S. PATENT DOCUMENTS

| 10,308,856 | B1* | 6/2019 | Wang | ........................ C09K 5/14 |
| 2012/0037041 | A1* | 2/2012 | Nolte | .................... B22F 1/0062 106/287.18 |
| 2015/0028085 | A1* | 1/2015 | Endoh | .................... B22F 1/0018 228/224 |

\* cited by examiner

*Primary Examiner* — Erin B Saad

(57) ABSTRACT

The present invention relates to a conductive paste for bonding that comprises a metal powder and a solvent, wherein the metal powder comprises a first metal powder having a particle diameter (D50) of 10 to 150 nm and a second metal powder having a particle diameter (D50) of 151 to 500 nm. The paste is useful for manufacturing an electronic device comprising a substrate with an electrically conductive layer and an electrical or electronic component, which are reliably bonded together using the paste.

7 Claims, 1 Drawing Sheet

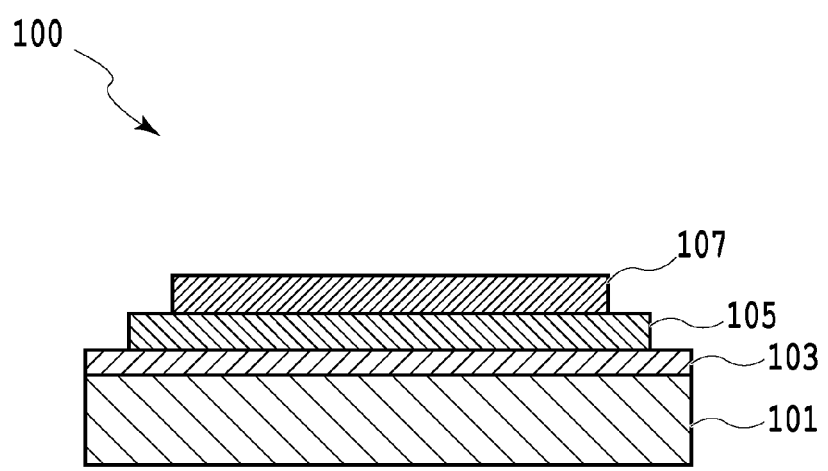

CONDUCTIVE PASTE FOR BONDING

FIELD OF THE INVENTION

The present invention relates to a conductive paste for bonding and a method for manufacturing an electronic device using the conductive paste.

TECHNICAL BACKGROUND OF THE INVENTION

An electronic device frequently comprises an electrical component such as a semiconductor chip that is bonded to an electrically conductive layer of a substrate using a conductive paste.

In this approach, the electrical component is physically and electrically connected to the electrically conductive layer by applying conductive paste onto the electrically conductive layer, mounting the electrical component on the conductive paste, and then heating the conductive paste. It has been found that currently used manufacturing processes and pastes frequently do not provide sufficient bonding between the mounted electrical component and the substrate to obtain a satisfactory construction of the electrical device.

JP2016-069710 discloses a joint material to manufacture an electrical device. The joint material contains silver nano particles having particle diameter of 1 to 200 nm and octanediol.

SUMMARY OF THE INVENTION

Aspects of the present invention provide a conductive paste that is capable of satisfactorily bonding an electrical component to a substrate during a manufacturing process, and a method of manufacturing an electrical or electronic device using the conductive paste.

Another aspect of the invention relates to a method of manufacturing an electrical device comprising the steps of: preparing a substrate comprising an electrically conductive layer; applying a conductive paste on the electrically conductive layer; wherein the conductive paste is a conductive paste for bonding comprising a metal powder and a solvent, wherein the metal powder comprises a first metal powder and a second metal powder, wherein the particle diameter (D50) of the first metal powder is 10 to 150 nm and the particle diameter (D50) of the second metal powder is 151 to 500 nm; mounting an electrical component on the applied conductive paste; heating the conductive paste to join the electrically conductive layer and the electrical component.

In one embodiment, the total content of the first metal powder and the second metal powder is 80 to 95 weight % (wt. %), and the solvent is 5 to 20 wt. %, wherein the weight % is based on the total weight of the conductive paste.

In one embodiment, each of the first metal powder and the second metal powder is selected from the group consisting of silver, copper, gold, palladium, platinum, rhodium, nickel, aluminum, an alloy thereof and a combination thereof.

In one embodiment, the mixing weight ratio of the first metal powder and the second metal powder (first metal powder:second metal powder) is 1:10 to 30:10.

In one embodiment, the conductive paste further comprises 0.05 to 5 wt. % of a polymer, wherein the weight % is based on the total weight of the conductive paste.

In one embodiment, the particle diameter of the second metal powder is at least 50 nm larger than the particle diameter of the first metal powder.

In one embodiment, the electrical component is a semiconductor chip. In one embodiment, the electronic component comprises a plating layer selected from the group consisting of nickel, gold, and alloys thereof.

In one embodiment, the method further comprises a step of drying at 40 to 150° C. after applying the conductive paste on the electrically conductive layer and before mounting the electronic component on the applied conductive paste.

Another aspect of the invention relates to a conductive paste for bonding comprising a metal powder and a solvent, wherein the metal powder comprises a first metal powder and a second metal powder, wherein the particle diameter (D50) of the first metal powder is 10 to 150 nm, and the particle diameter (D50) of the second metal powder is 151 to 500 nm.

The electronic component can be sufficiently bonded to the substrate by the conductive paste for bonding and the method of manufacturing an electronic device using the conductive paste of the present invention.

BRIEF DESCRIPTION OF DRAWINGS

FIG. 1 is a schematic drawing showing an example of an electronic device in cross-sectional view.

DETAILED DESCRIPTION OF INVENTION

An electronic device comprises at least a substrate comprising an electrically conductive layer and an electrical component. The electrically conductive layer of the substrate and the electrical component are bonded by the conductive paste. One embodiment of a method of manufacturing an electronic device 100 is explained by reference to FIG. 1.

The device is constructed on a substrate 101 that comprises an electrically conductive layer 103. In different embodiments, the conductive layer 103 may comprise a metallic conductor or a semiconductor. The electrically conductive layer 103 can also be an electrical circuit, an electrode or an electrical pad in certain embodiments. The electrically conductive layer 103 can be a layer of any suitable metal in another embodiment. The metal layer can comprise copper, silver, gold, nickel, palladium, platinum, or alloys thereof in another embodiment. The electrically conductive layer 103 can be a copper layer or a silver layer in another embodiment.

The conductive paste 105 is capable of bonding one metallic conductor to another, a metallic conductor to a semiconductor, or a semiconductor to another semiconductor. The conductive paste 105 is applied on the electrically conductive layer 103. The applied conductive paste 105 can be 50 to 500 μm thick in an embodiment, 80 to 300 μm thick in another embodiment, 100 to 200 μm thick in another embodiment. The conductive paste 105 is applied by any suitable deposition technique including, without limitation, screen printing. A mask (most commonly constructed of metal) can be used for the screen printing in some embodiments.

The applied conductive paste 105 is optionally dried. The drying temperature can be 40 to 150° C. in an embodiment, 50 to 120° C. in another embodiment, 60 to 100° C. in another embodiment. The drying time is 10 to 150 minutes in an embodiment, 15 to 80 minutes in another embodiment, 20 to 30 minutes in another embodiment.

The electrical component 107 is mounted on the applied conductive paste 105. The electrical component 107 is not particularly limited as long as it functions electrically. For example, electrical component 107 can be selected from the group consisting of a semiconductor chip, an integrated circuit (IC) chip, a chip resistor, a chip capacitor, a chip inductor, a sensor chip, and a combination thereof. The electrical component 107 can be a semiconductor chip in another embodiment. The semiconductor chip can be a Si chip or a SiC chip in another embodiment.

The electrical component 107 in some embodiments comprises a metallization layer, which may be situated in contact with the adjacent layer of the applied conductive paste 105. The material of the metallization layer can be selected from the group consisting of copper, silver, gold, nickel, palladium, platinum, alloy thereof and a mixture thereof in another embodiment. The metallization layer comprises gold and/or nickel in another embodiment. The metallization layer comprises a lamination of a gold layer and a nickel layer in still another embodiment. The metallization layer is provided by plating in another embodiment.

The layer of the conductive paste 105 is heated to accomplish the required bonding. In various embodiments, the heating is carried out in a die bonder set at a temperature between 150, 180, 200, or 220° C. and 260, 290, 310, and 400° C. for a heating time ranging between 0.1, 0.5, 3, or 8 min. and 3, 5, 13, 15, 20, or 30 min. Alternatively, the heating step can be carried out in an oven or using any other convenient heat source. Heat damage to the electrical component 107 can be minimized or eliminated because the conductive paste 105 can be bonded at a relatively low temperature.

In various embodiments, the heating step is carried out in different atmospheres, such as a reducing atmosphere (e.g., a $N_2$ atmosphere) or in air.

To improve adherence of the electrical component 107e to the conductive paste layer 105, pressure is applied on the electrical component 107 during the heating in some embodiments. The pressure can range from 0.1, 1, 5, 7, 15, or 25 MPa to 15, 25, 36, 40, or 45 MPa. A hot press molding machine or a die bonder equipped with a pressurizing and heating mechanism for semiconductor bonding can be used. Alternatively, the electrical component 107 can be bonded without pressurization.

The composition of the conductive paste 105 is explained hereafter. The conductive paste 105 comprises a metal powder and a solvent.

Metal Powder

The metal powder comprises a first metal powder and a second metal powder. The particle diameter (D50) of the first metal powder is 10 to 150 nm and the particle diameter (D50) of the second metal powder is 151 to 500 nm. The particle diameter (D50) is a volume average particle diameter (D50) measured by a dynamic light scattering method using a dynamic light scattering particle size analyzer (LB 550, Horiba Ltd.).

In various embodiments, the particle diameter (D50) of the first metal powder ranges from a lower limit of 20, 30, 40, 50, 55, 65, 75, 85, or 95 nm to an upper limit of 70, 80, 90, 105, 110, 120, 130, or 150 nm.

The first metal powder is selected from the group consisting of silver, copper, gold, palladium, platinum, rhodium, nickel, aluminum, an alloy thereof and a combination thereof in an embodiment. The first metal powder is selected from the group consisting of silver, copper, nickel, an alloy thereof and a combination thereof in another embodiment. The first metal powder is silver in another embodiment.

The shape of the first metal powder is in the form of flake, spherical, amorphous or a mixture thereof in an embodiment. The shape of the first metal powder is a mixture of flake and spherical in another embodiment. By "spherical powder" is meant a powder of particles that have a ratio of the largest diameter of each particle to the smallest diameter of at most 2:1. In other embodiments, the ratio is at most 1.8:1, 1.5:1, or 1.3:1, depending on how the powder is prepared.

The size of the particles of the metal powder used in the present composition may be specified by values of D50. Unless otherwise indicated, the term "particle diameter" refers herein to a value of "D50," which is a median particle size by volume, which may be determined using a laser diffraction method carried out with using Microtrac X-100 (Montgomeryville, Pa.) instrument.

In some embodiments, the first metal powder is itself a mixture of two kinds of metal powders having different particle sizes. The first metal powder comprises a first metal powder A and a first metal powder B in another embodiment. The particle diameter (D50) of the first metal powder A is 10 to 80 nm and the particle diameter (D50) of the first metal powder B is 81 to 150 nm in another embodiment. The particle diameter (D50) of the first metal powder A is 20 to 75 nm in another embodiment, 30 to 70 nm in another embodiment, 40 to 68 nm in another embodiment, 50 to 65 nm in another embodiment. The particle diameter (D50) of the first metal powder B is 85 to 140 nm in another embodiment, 88 to 130 nm in another embodiment, 92 to 120 nm in another embodiment, 95 to 110 nm in another embodiment.

The particle diameter of the first metal powder B is larger than the particle diameter of the first metal powder A by 10 to 100 nm in an embodiment. The particle diameter of the first metal powder B is larger than the particle diameter of the first metal powder A by 20 to 80 nm in another embodiment. The particle diameter of the first metal powder B is larger than the particle diameter of the first metal powder A by 30 to 60 nm in another embodiment.

The mixing weight ratio of the first metal powder A and the first metal powder B (first metal powder A:first metal powder B) is 1:10 to 30:10 in an embodiment, 4:10 to 22:10 in another embodiment, 6:10 to 18:10 in another embodiment, 8:10 to 15:10 in another embodiment, 9:10 to 12:10 in another embodiment.

In an aspect, the present disclosure contemplates an embodiment of the conductive paste wherein the first metal powder is a mixture of the first metal powder A and the first metal powder B having different particle diameters, wherein the particle diameter (D50) of the first metal powder A is 10 to 80 nm and the particle diameter (D50) of the first metal powder B is 81 to 150 nm. The first metal powder is a mixture of the first metal powder A and the first metal powder B in an embodiment. The first metal powder is the first metal powder A in another embodiment. The first metal powder is the first metal powder B in another embodiment.

The particle diameter (D50) of the second metal powder is 160 to 350 nm in another embodiment, 175 to 290 nm in another embodiment, 182 to 250 nm.

The second metal powder is selected from the group consisting of silver, copper, gold, palladium, platinum, rhodium, nickel, aluminum, an alloy thereof and a combination thereof in an embodiment. The second metal powder is selected from the group consisting of silver, copper, nickel, and an alloy thereof and a combination thereof in another embodiment. The second metal powder is silver in another embodiment.

The shape of the second metal powder is in the form of flake, spherical, amorphous or a mixture thereof in an embodiment. The second metal powder is a mixture of flake and spherical in another embodiment.

The mixing weight ratio of the first metal powder and the second metal powder (first metal powder:second metal powder) is 1:10 to 30:10 in an embodiment, 3:10 to 25:10 in another embodiment, 4:10 to 23:10 in another embodiment, 5:10 to 21:10 in another embodiment, 7:10 to 17:10 in another embodiment, 8:10 to 14:10 in another embodiment, 9:10 to 12:10 in another embodiment.

The total amount of the first metal powder and the second metal powder in various embodiments ranges from a lower limit of 60 weight percent (wt. %), 72 wt. %, 80 wt. %, or 85 wt. %, to an upper limit of 93 wt. %, 95 wt. %, or 97 wt. %, based on the total weight of the conductive paste 105.

The particle diameter of the second metal powder is larger than the particle diameter of the first metal powder by 50 to 200 nm in an embodiment. The particle diameter of the second metal powder is larger than the particle diameter of the first metal powder by 80 to 150 nm in another embodiment. The particle diameter of the second metal powder is larger than the particle diameter of the first metal powder by 90 to 110 nm in another embodiment.

The particle size distribution of the mixed powder of the first metal powder and the second metal powder could have two peaks in an embodiment. The particle size distribution of the first metal powder and the particle size distribution of the second metal powder can be different from each other in another embodiment. The first metal powder and the second metal powder having different particle diameters can be different kinds of metal powders in another embodiment.

As known to a skilled person, virtually all particulate materials in commerce are provided as an ensemble of individual particles having a range of sizes, so that "particle size" must be specified by parameters that statistically characterize the actual distribution. The D50 value, or median particle size by volume, is commonly used to represent the approximate particle size. Unless otherwise stated, references herein to the "particle diameter" of an ensemble of particles are thus to be understood as the D50 value of the ensemble. Other common statistically derived measures of particle size include D10 and D90, which indicate that 10 vol. % and 90 vol. % of the particles in the ensemble have a size less than D10 and D90, respectively. These values, taken either singly or in combination with the D50 values, can provide additional characterization of a particle distribution, which is especially useful for a distribution that is not symmetrical, or multimodal, or complex. Values such as D10 and D90 are ordinarily reported along with D50 by commercial particle size measurement equipment. The breadth of the particle distribution typically can be characterized by how much the values of D10 and/or D90 differ from D50; a large difference is ordinarily associated with a broad distribution.

A particle size distribution taken of the mixed metal powder provided in the present disclosure may be multimodal, meaning that a graphical plot of the distribution has more than one peak, corresponding to the differences in particle size distributions characterizing the different multiple powder sources. Each of the peaks corresponds to a particle size. For example, a metal powder prepared by blending two powders having different particle size distributions and different values of D50 will ordinarily exhibit a particle size distribution of the combined powders having two peaks corresponding approximately to the D50 values of the two subpopulations. The heights of the different peaks depend on the relative amounts of the various powder sources in the mixture, and the breadth of their distributions and the difference between their D50 values. For some embodiments, multiple discrete peaks are apparent in the overall powder size distribution, with each peak corresponding approximately to a D50 value of one of the constituent powders used to prepare the mixture. In others, the multimodal distribution may be manifest as one or more shoulders on a more intense peak. Known numerical methods may be used to establish the presence of multiple peaks in such multimodal distributions.

The particle size distribution comprises a first mode corresponding to a particle size of 10 to 150 nm and a second mode corresponding to a particle size of 151 to 500 nm in an embodiment. The first mode and second mode correspond to particle sizes that differ by at least 50 nm in an embodiment.

Solvent

The metal powder is dispersed in a suitable solvent to form the conductive paste. The amount of solvent can be varied to adjust the viscosity so that the conductive paste 105 can be readily applied onto the substrate 101 or the electrically conductive layer 103. All or most of the solvent evaporates from the conductive paste 105 during the drying step or the heating step.

The molecular weight of the solvent is 600 or less in an embodiment, 520 or less in another embodiment, 480 or less in another embodiment, 400 or less in another embodiment. The molecular weight of the solvent is at least 10 in an embodiment, at least 100 in another embodiment, at least 150 in another embodiment, at least 180 in another embodiment.

All or most of the solvent evaporates from the conductive paste 105 in the drying step or the heating step. The boiling point of the solvent is 100 to 450° C. in an embodiment, 150 to 320° C. in another embodiment, 200 to 290° C. in another embodiment. The solvent is an organic solvent in an embodiment.

Suitable solvents include ones selected from the group consisting of ester alcohols, 1-phenoxy-2-propanol, terpineol, carbitol acetate, ethylene glycol, butyl carbitol, dibutyl carbitol, dibutyl acetate propylene glycol phenyl ether, ethylene glycol monobutyl ether, butyl carbitol acetate, 1,2-cyclohexane dicarboxylic acid diisononyl ester and a mixture thereof in another embodiment. A preferred ester alcohol is the monoisobutyrate of 2,2,4-trimethyl-1,3-pentanediol, which is available commercially from Eastman Chemical (Kingsport, Tenn.) under the tradename TEXANOL™.

In some embodiments, conductive paste 105 has a viscosity that is between 10, 12, or 15 Pa·s and 50, 100, or 300 Pa·s, when measured at a shear rate of 10 sec$^{-1}$ with a rheometer (HAAKE™ MARS™ III, Thermo Fisher Scientific Inc.) using a titanium cone plate C20/1°.

The solvent is present in some embodiments in an amount ranging 5, 6.5, 7.8, or 8.8 parts by weight to 13, 15, or 20 parts by weight, when the metal powder is 100 parts by weight of the conductive paste.

Polymer

The conductive paste 105 optionally comprises a polymer that is soluble in the solvent and has a molecular weight (Mw) of 1,000 or more. In other embodiments, the molecular weight (Mw) of the polymer has a value between 1,000, 5,000, 10,000, 18,000, 25,000, or 32,000 and 200,000, 350,000, 480,000, 610,000, 780,000, or 900,000. Unless otherwise stated, references to the molecular weight of polymers in the present application pertain to weight average molecular weight (Mw), which can be measured with a high-performance liquid chromatography system, such as an Alliance 2695 system (Nippon Waters Co., Ltd.) or the like.

In an embodiment, the polymer in the present composition is selected from the group consisting of ethyl cellulose, methylcellulose, hydroxypropyl cellulose, polyvinyl butyral resin, phenoxy resin, polyester resin, epoxy resin, acrylic resin, polyimide resin, polyamide resin, polystyrene resin, butyral resin, polyvinyl alcohol resin, polyurethane resin and a mixture thereof in an embodiment. The polymer is ethyl cellulose in another embodiment.

The glass transition temperature of the polymer is −30 to 250° C. in an embodiment, 10 to 180° C. in another embodiment, 80 to 150° C. in another embodiment.

In various embodiments, the polymer is present in an amount in a range from 0.1, 1, or 2.5 parts by weight to 4, 5, or 6 parts by weight, when the total of the first metal powder and the second metal powder is 100 parts by weight.

In other embodiments, the polymer is present in an amount in a range from 0.1, 0.5, or 1.5 wt. % to 3.1, 3.5, or 4 wt. %, based on the total weight of the conductive paste 105.

Additive

One or more additives including, without limitation, surfactants, dispersing agents, emulsifiers, stabilizers, plasticizers, or other known paste additives can be further incorporated in conductive paste 105 to improve its functional properties in one or more of its formulation, storage, application, and end use. The conductive paste 105 does not comprise a glass frit in an embodiment. Embodiments in which conductive paste 105 does not comprise a curing agent or a cross-linking agent are also contemplated herein.

Without being bound by any specific theory of operation, it is believed the first metal powder performs the function of promoting sintering and bonding between metals at low temperature in the conductive paste, while the second metal powder performs the function of suppressing abrupt shrinkage in the conductive paste. As a result, an electronic device in which an electronic component is sufficiently bonded to a substrate can be provided.

EXAMPLES

The present invention is illustrated by, but is not limited to, the following examples.

Examples 1-2

Conductive pastes were prepared by dispersing various silver powders in a mixture of an organic solvent and a polymer. The dispersion was carried out by mixing the components in a mixer followed by a three-roll mill. The solvent was TEXANOL™ ester alcohol.

Spherical silver powders having different particle diameters (D50) (60 nm, 100 nm, 200 nm, 300 nm) were prepared and incorporated in the pastes of Examples 1-2 and Comparative Examples 1-3, as shown in Table 1. The viscosity of each conductive paste was 25 to 30 Pa·s, as measured at a shear rate of 10 sec$^{-1}$ using a rheometer (HAAKE™ MARS™ III, titanium cone-plate:C20/1°, Thermo Fisher Scientific Inc.).

Next, a conductive paste layer was formed for each example by applying the conductive paste on a copper plate. A series of pressure-sensitive tapes (Scotch® Magic™ MP-18 transparent tape, 3M Corporation) were put on copper plates (15 mm wide, 30 mm long, 1 mm thick), leaving a space of 15 mm between adjacent pieces. The conductive paste was applied with a scraper over the tapes to fill the space between them with the conductive paste. The tapes were peeled off, leaving behind the applied conductive paste in a pattern of squares 10 mm wide, 10 mm long, 150 μm thick. The conductive paste layer was dried at 80° C. for 60 minutes in an oven.

A SiC chip (3 mm wide, 3 mm long, 360 μm thick) was mounted on the conductive paste layer. The SiC chip was bonded to the copper plate by using a die-bonder (T-3002M, Tresky AG) under the heating condition of 1 0MPa/280° C./1 minute.

A thermal cycling test was performed on the bonded body of the copper plate and the SiC chip as thus formed. For each cycle, the bonded body was first exposed to −55° C. for 30 minutes and then to 175° C. for 30 minutes, with a transition time of 30 seconds or less between temperatures. The cycling was repeated 300 times.

Thereafter, an ultrasonic microscope (SAT, Fine SAT200III, Hitachi Power Solutions Co., Ltd.) was used to determine the bonding area for each sample, i.e., the relative portion of the chip's area that remained attached to the substrate after the thermal cycling test. Specifically, the bonding areas were evaluated from images drawn with the intensity of reflection or transmission of the ultrasonic waves emitted from the SAT to the bonded body on the side of the SiC chip.

The results are shown in Table 1. The bonding area was 80% or more for pastes wherein the metal powder was a mixture of two silver powders, the first having a particle diameter of 100 nm and the second either 200 nm or 300 nm (Examples 1 and 2, respectively). A much smaller bonding area was seen for Comparative Examples 1 to 3, which were formulated either with single silver powders having a particle diameter of 200 nm or 100 nm (Comparative Examples 1 and 2, respectively) or a mixture of silver particles having diameters of 100 nm and 60 nm. Each of the Comparative Examples 1-3 had a bonding area of 66% or smaller.

TABLE 1

| | | Com. Example 1 | Com. Example 2 | Com. Example 3 | Example 1 | Example 2 |
|---|---|---|---|---|---|---|
| | | | | | | (parts by weight) |
| Ag | (300 nm) | 0 | 0 | 0 | 50 | 0 |
| powder | (200 nm) | 100 | 0 | 0 | 0 | 50 |
| (D50) | (100 nm) | 0 | 100 | 50 | 50 | 50 |
| | (60 nm) | 0 | 0 | 50 | 0 | 0 |
| Solvent | | 10.5 | 10.5 | 10.5 | 10.5 | 10.5 |
| Polymer | | 0.4 | 0.4 | 0.4 | 0.4 | 0.4 |
| Bonding area (%) | | 65.5 | 64.1 | 45.0 | 82.7 | 94.5 |

Examples 3-5

The effect of the mixing ratio of the silver powder (first metal powder) of the particle diameter of 100 nm and the silver powder (second metal powder) of the particle diameter of 200 nm on the bonding strength was investigated. Conductive pastes were prepared in the same manner as in Examples 1-2, except that the mixing ratio of the first silver metal powder (particle diameter of 100 nm) and the second silver metal powder (particle diameter of 200 nm) was varied, as shown in Table 2. The conductive paste was applied on the copper plate in the same manner as in Examples 1-2, except that copper chips were used instead of SiC chips. The chips were bonded using the same die bonder and then subjected to the same thermal cycling test.

The bonding strength between the copper chip and the copper plate for each example was measured after thermal cycling. The testing was done in accordance with a standard die shear test method (MIL STD-883) using a bond tester (4000 Plus, Nordson Advanced Technology Co., Ltd.). The bond strength was defined as the strength when the copper chip was peeled off by the bond tester.

The results are shown in Table 2. The bonding strength was 28 MPa or more for all the mixing ratios tested.

TABLE 2

|  |  | Example 3 | Example 4 | (parts by weight) Example 5 |
|---|---|---|---|---|
| Ag powder | (200 nm) | 50 | 33 | 67 |
| (D50) | (100 nm) | 50 | 67 | 33 |
| Solvent |  | 10.5 | 10.5 | 10.5 |
| Polymer |  | 0.4 | 0.4 | 0.4 |
| Bonding strength (MPa) |  | 39.8 | 28.0 | 30.4 |

Examples 6-8

Next, the effect of changing the amount of the metal powder in the paste composition was investigated. Conductive pastes were prepared in the same manner as in Examples 1-5, except that the total amount of the metal powder relative to the solvent and polymer was changed, as shown in Table 3. For each example, the silver powder contained equal weights of silver particles with 100 nm and 200 nm particle diameters (D50). Copper chips were again bonded to a copper plate substrate using the same die bonder as before, thermally cycled, and then tested to determine bonding area using the SAT ultrasonic microscope in the same manner as in Examples 1-2. The bonding area was 77% or more when the metal powder was 85.3 wt %, 86.6 wt % and 87.8 wt % (Example 6 to 8).

TABLE 3

|  | Example 6 | Example 7 | (wt. %) Example 8 |
|---|---|---|---|
| Ag powder* | 85.3 | 86.6 | 87.8 |
| Solvent | 13.7 | 12.6 | 11.5 |
| Polymer | 1.0 | 0.8 | 0.7 |
| Bonding Area (%) | 77 | 87 | 95 |

*The Ag powder contained equal portions by weight of particles with D50 of 100 nm and 200 nm.

Examples 9-10

A conductive paste was prepared in the same manner as in Example 2 except that the kind of metal powder was changed as shown in Table 4. The copper chip was bonded to the copper plate with the conductive paste, and the bonding strength was measured. The bonding method was the same as in Example 3 except that the heating condition was 10 MPa/250° C./10 minute. The measurement method of the bonding strength was the same as in Example 3. The result is shown in Table 4. The bonding strength was as high as 56 MPa or more when the mixing ratio of the silver powder of the particle diameter of 200 nm and the silver powder of the particle diameter of 60 nm was 68:32 (Example 9), and when the mixing ratio of the silver powder of the particle diameter of 200 nm, the silver powder of the particle diameter of 100 nm and the silver powder of the particle diameter of 60 nm was 67:17:16 (Example 10).

TABLE 4

|  |  | Example 9 | (parts by weight) Example 10 |
|---|---|---|---|
| Ag powder | (200 nm) | 68 | 67 |
| (D50) | (100 nm) | 0 | 17 |
|  | (60 nm) | 32 | 16 |
| Solvent |  | 14 | 13 |
| Polymer |  | 0.4 | 0.4 |
| Bonding strength (MPa) |  | 65.5 | 56.6 |

Having thus described the invention in rather full detail, it will be understood that this detail need not be strictly adhered to but that further changes and modifications may suggest themselves to one skilled in the art, all falling within the scope of the invention as defined by the subjoined claims.

For example, a skilled person would recognize that the choice of raw materials could unintentionally include impurities that may be incorporated into the oxide composition or other paste constituents during processing. These incidental impurities may be present in the range of hundreds to thousands of parts per million. Impurities commonly occurring in industrial materials used herein are known to one of ordinary skill.

Where a range of numerical values is recited or established herein, the range includes the endpoints thereof and all the individual integers and fractions within the range, and also includes each of the narrower ranges therein formed by all the various possible combinations of those endpoints and internal integers and fractions to form subgroups of the larger group of values within the stated range to the same extent as if each of those narrower ranges was explicitly recited. Where a range of numerical values is stated herein as being greater than a stated value, the range is nevertheless finite and is bounded on its upper end by a value that is operable within the context of the invention as described herein. Where a range of numerical values is stated herein as being less than a stated value, the range is nevertheless bounded on its lower end by a non-zero value. It is not intended that the scope of the invention be limited to the specific values recited when defining a range.

In this specification, unless explicitly stated otherwise or indicated to the contrary by the context of usage, where an embodiment of the subject matter hereof is stated or described as comprising, including, containing, having, being composed of, or being constituted by or of certain features or elements, one or more features or elements in addition to those explicitly stated or described may be present in the embodiment. An alternative embodiment of the subject matter hereof, however, may be stated or described as consisting essentially of certain features or elements, in which embodiment features or elements that would materially alter the principle of operation or the distinguishing characteristics of the embodiment are not present therein. A further alternative embodiment of the subject matter hereof may be stated or described as consisting of certain features or elements, in which embodiment, or in insubstantial variations thereof, only the features or elements specifically stated or described are present. Additionally, the term "comprising" is intended to include examples encompassed by the terms "consisting essentially of" and "consisting of." Similarly, the term "consisting essentially of" is intended to include examples encompassed by the term "consisting of."

In this specification, unless explicitly stated otherwise or indicated to the contrary by the context of usage, amounts, sizes, ranges, formulations, parameters, and other quantities and characteristics recited herein, particularly when modified by the term "about," may but need not be exact, and may also be approximate and/or larger or smaller (as desired) than stated, reflecting tolerances, conversion factors, rounding off, measurement error, and the like, as well as the inclusion within a stated value of those values outside it that have, within the context of this invention, functional and/or operable equivalence to the stated value.

What is claimed is:

1. A method of manufacturing an electronic device comprising the steps of:
    preparing a substrate comprising an electrically conductive layer;
    applying a conductive paste on the electrically conductive layer, wherein the conductive paste comprises a metal powder, 0.1-1.5 wt % of a polymer based on the total weight of the conductive paste and a solvent, wherein the metal powder comprises a first metal powder and a second metal powder, wherein the particle diameter (D50) of the first metal powder is 50 to 150 nm, and wherein the particle diameter (D50) of the second metal powder is 151 to 500 nm;
    mounting an electrical component on the applied conductive paste;
    heating the conductive paste to bond the electrically conductive layer and the electrical component.

2. The method of claim 1, wherein the electrical component is a semiconductor chip.

3. The method of claim 1, wherein the electronic component includes a plating layer selected from the group consisting of nickel, gold, and alloys thereof.

4. The method of claim 1, wherein the method further comprises the step of drying at 40 to 150° C. after applying the conductive paste on the electrically conductive layer and before mounting the electronic component on the applied conductive paste.

5. The method of claim 1, wherein the polymer has weight average molecular weight (Mw) of 5,000-780,000 g/mol.

6. The method of claim 1, wherein weight ratio of the first metal powder and the second metal powder (first metal powder:second metal powder) is 3:10 to 12:10.

7. The method of claim 6, wherein total amount of the first metal powder and the second metal powder is 72 wt % to 97 wt %, based on the total weight of the conductive paste.

* * * * *